(12) United States Patent
Duval et al.

(10) Patent No.: US 12,398,931 B2
(45) Date of Patent: Aug. 26, 2025

(54) COOLING DEVICE COMPRISING A PARAMAGNETIC GARNET CERAMIC

(71) Applicant: COMMISSARIAT A L'ENERGIE ATOMIQUE ET AUX ENERGIES ALTERNATIVES, Paris (FR)

(72) Inventors: Jean-Marc Duval, Grenoble (FR); Christophe Marin, Grenoble (FR); Diego Augusto Paixao Brasiliano, Grenoble (FR); Emmanuelle Bichaud, Grenoble (FR); Jean-Louis Durand, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 687 days.

(21) Appl. No.: 16/721,597

(22) Filed: Dec. 19, 2019

(65) Prior Publication Data

US 2020/0200444 A1  Jun. 25, 2020

(30) Foreign Application Priority Data

Dec. 20, 2018 (FR) ...................... 18 73565

(51) Int. Cl.
*F25B 21/00* (2006.01)
*H01F 1/01* (2006.01)
*H10N 15/20* (2023.01)

(52) U.S. Cl.
CPC ............. *F25B 21/00* (2013.01); *H01F 1/015* (2013.01); *C04B 2235/764* (2013.01);
(Continued)

(58) Field of Classification Search
CPC ................ F25B 21/00; F25B 2321/002; F25B 2321/0021; F25B 2321/0022;
(Continued)

(56) References Cited

U.S. PATENT DOCUMENTS 3,841,107 A * 10/1974 Clark ...................... F25B 21/00
62/3.1
4,441,325 A    4/1984 Bon-Mardion et al.
(Continued)

FOREIGN PATENT DOCUMENTS

DE   10 2017 102 163 A1   8/2018
EP      0 081 411 A1       6/1983
(Continued)

OTHER PUBLICATIONS

Gorshkova, O.V., Lukin, E.S. Sintering and properties of the ceramics made from gadolinium-gallium garnet of nonstoichiometric composition, 1987, Glass Ceram 44, 122-125. https://doi.org/10.1007/BF00697262 (Year: 1987).*

(Continued)

*Primary Examiner* — Jianying C Atkisson
*Assistant Examiner* — Ibrahim A. Michael Adeniji
(74) *Attorney, Agent, or Firm* — Oblon, McClelland, Maier & Neustadt, L.L.P.

(57) ABSTRACT

A magnetic cooling device includes a magnetocaloric element, the magnetocaloric element being a paramagnetic garnet ceramic. The density of the paramagnetic garnet ceramic is preferably greater than or equal to 90%. The garnet ceramic is preferably a gadolinium gallium garnet ceramic or an ytterbium gallium garnet ceramic.

21 Claims, 5 Drawing Sheets

(52) U.S. Cl.
CPC ............... *F25B 2321/0021* (2013.01); *F25B 2321/0022* (2013.01); *H10N 15/20* (2023.02)

(58) Field of Classification Search
CPC ............ F25B 2321/0023; H01F 1/015; C04B 2235/764; H10N 15/20; Y02B 30/00
See application file for complete search history.

(56) References Cited

U.S. PATENT DOCUMENTS

| | | | | |
|---|---|---|---|---|
| 4,507,928 | A * | 4/1985 | Johnson | F25B 21/00 62/3.1 |
| 4,599,866 | A * | 7/1986 | Nakagome | F25B 21/00 505/891 |
| 4,674,288 | A * | 6/1987 | Kuriyama | F25B 21/00 62/3.3 |
| 4,702,090 | A * | 10/1987 | Barclay | F25B 21/00 62/3.6 |
| 5,209,068 | A * | 5/1993 | Saji | F25B 21/00 505/891 |
| 5,653,379 | A * | 8/1997 | Forster | C04B 37/021 228/124.1 |
| 6,383,964 | B1 * | 5/2002 | Nakahara | C04B 35/18 501/127 |
| 6,544,458 | B1 * | 4/2003 | Hansma | B22C 1/00 264/237 |
| 2001/0028700 | A1 * | 10/2001 | Duclos | C04B 35/6455 378/98 |
| 2005/0157219 | A1 | 7/2005 | Sekijima et al. | |
| 2007/0125095 | A1 * | 6/2007 | Iwasaki | F25B 21/00 62/3.1 |
| 2007/0144181 | A1 * | 6/2007 | Kitanovski | F25B 21/00 62/3.1 |
| 2008/0190034 | A1 * | 8/2008 | Rosenflanz | C04B 35/6261 501/48 |
| 2012/0222427 | A1 * | 9/2012 | Hassen | F25B 21/00 62/3.1 |
| 2014/0338365 | A1 | 11/2014 | Tasaki et al. | |
| 2015/0044444 | A1 * | 2/2015 | Gell | C23C 4/10 415/230 |
| 2018/0164001 | A1 * | 6/2018 | Schwartz | F25B 21/00 |

FOREIGN PATENT DOCUMENTS

| | | |
|---|---|---|
| EP | 1 544 328 A1 | 6/2005 |
| EP | 2 762 801 A1 | 8/2014 |
| JP | 2-129097 | 5/1990 |
| KR | 20080038179 A * | 5/2008 |
| WO | WO-2018233114 A1 * | 12/2018 |

OTHER PUBLICATIONS

Microstructure. Accessed Apr. 23, 2025, Morgan Advanced Materials, https://www.morgantechnicalceramics.com/en-gb/ceramics-101/mechanical-properties-of-ceramics/microstructure/. (Year: 2023)*
U.S. Appl. No. 15/687,944, filed Aug. 28, 2017, 20180058258 A1, Durand et al.
U.S. Appl. No. 16/075,454, filed Aug. 3, 2018, 2019/0055379 A1, Duval et al.
French Preliminary Search Report Issued Nov. 13, 2019 in French Application 18 73565 filed on Dec. 20, 2018 (with English Translation of Categories of Cited Documents), 3 pages.
C. Hagmann et al., "Two-stage magnetic refrigerator for astronomical applications with reservoir temperatures 4K", Cyrogenics, vol. 34, No. 3, 1994, 6 pages.
A.J. Degregoria et al., "Test Results of an Active Magnetic Regenerative Refrigerator", Advances in Cyrogenic Engineering, vol. 37, Part B, 1992, 8 pages.
A.F. Lacaze et al., "Efficiency improvements of a double acting reciprocating magnetic refrigerator", CYROGENICS, vol. 23, No. 8, 1983, 6 pages.

* cited by examiner

COOLING DEVICE COMPRISING A PARAMAGNETIC GARNET CERAMIC

TECHNICAL FIELD

The invention relates to a cooling device based on a paramagnetic garnet-ceramic, more particularly for use in cryogenics. The invention is also applicable to cooling devices for temperatures higher than cryogenic temperatures and in particular for industrial and domestic applications.

STATE OF PRIOR ART

Magnetic refrigeration has been known since the beginning of the 20th century. The cooling effect is obtained by associating a paramagnetic material (said to be magnetocaloric) with a variable external magnetic field. When the material is magnetised or demagnetised, its temperature varies substantially. This type of refrigeration can be used for refrigeration in all temperature ranges varying from ambient temperature (about 250 K to 300 K), to so-called cryogenic temperatures (T<120 K) and particularly for very low temperatures (T<10 K and preferably T<5 K).

A cooling device comprises a magnetocaloric element based on a paramagnetic material (called "magnetic coolant) arranged at the centre of a coil of conducting wire, classically superconducting forming a variable magnetic field source, a heat source and a cold source. The heat source and the cold source are classically separated from the magnetocaloric element by thermal switches.

The use of magnetic refrigeration takes place simply and routinely at cryogenic temperatures using an inverse Carnot cycle (FIG. 1). This classical cooling cycle comprises:
- an adiabatic magnetisation phase followed by an isothermal magnetisation phase at temperature $T_c$, during which the external magnetic field increases up to a value $B_1$; the thermal switch to the heat source is in the closed position to evacuate heat.
- an adiabatic demagnetisation phase of the magnetic material: the thermal switches are open and the magnetic field reduces, the magnetic material cools to the operating temperature Tf, and
- an isothermal demagnetisation, during which the switch to the cold source is closed so as to bring the paramagnetic material into contact with the element to be refrigerated; the magnetic field continues to drop to a low but non-zero value.

When the magnetic field reaches its minimum value, the temperature will rise, and then a new cycle is started.

Paramagnetic materials classically used to obtain the cooling effect at cryogenic temperatures are hydrated paramagnetic salts, particularly alums such as ferric ammonium alums (FAA) and rare earth oxides, and particularly garnets such as gadolinium gallium garnet $Gd_3Ga_5O_{1a2}$ (Wikus et al. «Magnetocaloric materials and the optimization of cooling power density», Cryogenics (2014), http://dx.doi.org/10.1016/j.cryogenics.2014.04.005).

Ferric ammonium alums are particularly well adapted to temperatures of less than 1 Kelvin. However, they must be kept within a sealed chamber to prevent them from dehydrating and since they dissolve copper, they are usually used with a gold thermal bus. Furthermore, they can never be used for applications for which the temperature exceeds 35° C. at a given moment because they decompose.

Furthermore, it is known that garnets in monocrystalline form can be used in cooling devices. When they are used in monocrystalline form, garnets have a thermal conductivity that can be sufficient, particularly at low temperature that is the temperature range in which the magnetocaloric properties of the material are most useful. For example, they are obtained by a vertical zone melting method by optical heating. However, with this manufacturing method, it is impossible to obtain parts with large dimensions and manufacturing costs are high. Furthermore, monocrystalline materials are mechanically weak and it is not easy to integrate them.

Therefore there is a need to replace existing magnetocaloric materials with other materials.

PRESENTATION OF THE INVENTION

One purpose of this invention is to overcome the disadvantages of prior art.

To achieve this, this invention discloses a cooling device comprising a magnetocaloric element, the magnetocaloric element comprising a paramagnetic garnet ceramic.

The invention is fundamentally different from prior art due to the use of a paramagnetic garnet in ceramic form.

Ceramic means engineering ceramics based on oxides (also called oxide ceramics). A ceramic is a set of partially coalesced grains. Partially coalesced means that some grains are coalesced and other grains are not coalesced.

The dimensions of grains are different and grains are separated from each other by grain boundaries. Grain boundaries delimit zones with different crystalline orientations. In other words, crystalline orientations of two adjacent grains on different sides of a grain boundary are different.

Ceramics are solid and dense materials. Preferably, the density of the ceramic is greater than 80% and less than 100%. Production of the ceramic does not involve a fusion phase.

For comparison, a monocrystal does not have a grain boundary and is formed from a single matrix with an identical crystalline orientation at all points. The density of a monocrystal is 100%.

Ceramics have particularly high mechanical properties, and do not cleave, unlike monocrystals. Such ceramics are particularly advantageous for space applications because they can resist mechanical takeoff stresses.

Even if the use of a ceramic in a cooling device at first sight appears to be prohibitive due to its low thermal conductivity due to the grain boundaries in the ceramic, the applicant has observed that paramagnetic garnet ceramics do have sufficient thermal conductivities for integration into a cooling device.

Garnet means an oxide material with general formula $A'_3B'_2(C'O_4)_3$, and advantageously a material with formula $A'_3B'_5O_{12}$ in which:

A' corresponding to one or several rare earths, preferably chosen from among erbium, dysprosium, ytterbium and/or gadolinium; preferably it is ytterbium or gadolinium, possibly substituted by erbium or dysprosium, B' is a metallic element, for example gallium and/or aluminium, and C' is a metallic element, for example gallium and/or aluminium.

According to one advantageous embodiment, the magnetocaloric element is composed of the paramagnetic garnet ceramic.

Advantageously, the ceramic contains gallium.

According to a first advantageous embodiment, the ceramic is a gadolinium gallium garnet ceramic. This garnet is known as a "gadolinium gallium garnet" (GGG). This garnet is particularly useful to obtain cold temperatures of 500 mK to 4 K, from a heat source of 2 to 10 K.

According to a second advantageous embodiment, the garnet is an ytterbium gallium garnet (YbGG) ceramic. This material is particularly suitable for cold temperatures of the order of 100 mK to 1 K. It can be used from a heat source of 300 mK to 4 K.

These materials based on paramagnetic garnet ceramics, and particularly GGG or YbGG can be used to obtain efficient cooling devices while being easy to integrate and mechanically robust compared with other classically used materials. In particular, the use of YbGG in the form of a monocrystal is complicated due to its weakness and difficulty of use. Therefore it has never been used for magnetic refrigeration. According to the invention, the use of YbGG or GGG in ceramic form makes it easy to make large dimension parts (for example larger than 70 cm$^3$).

Advantageously, the density of the ceramic is greater than or equal to 90% and is less than 100%, and preferably greater than or equal to 95% and less than 100%. The higher the density of the ceramic, the higher will be the thermal conductivity. A high density maximises the cooling effect.

Advantageously, the volume of the magnetocaloric element varies from 1 mm$^3$ to 500 dm$^3$, and preferably it varies from 1 cm$^3$ to 100 cm$^3$. Shaping of ceramic materials by machining is facilitated, so that large dimension parts and/or parts with complex shapes can be obtained at lower cost.

Such a device is particularly suitable for use at very low temperatures (<10 K).

Advantageously, the magnetocaloric element is fixed to one or several metallic elements. The metallic elements may have the same nature or different natures. Since ceramic is a particularly strong material compared with monocrystals, one or several metallic elements can be fixed onto the magnetocaloric element, by bonding and preferably by brazing. According to one particular embodiment, the metallic element, for example made of copper, can be used as a thermal bus to improve thermal conduction and operation of the device. According to one particular embodiment, the metallic element, for example made of stainless steel, forms an enclosure around the magnetocaloric element, for example to contain a heat transporting fluid in the liquid or gas state, such as helium.

BRIEF DESCRIPTION OF THE DRAWINGS

This invention will be better understood after reading the description of example embodiments given purely for information and that is in no way limitative, with reference to the appended drawings on which.

The different parts shown on the figures are not necessarily all at the same scale, to make the figures more easily understandable.

The different possibilities (variants and embodiments) must be understood as not being mutually exclusive and can be combined with each other.

DETAILED PRESENTATION OF PARTICULAR EMBODIMENTS

In the following, the paramagnetic garnet ceramic is described for use in a cooling device, and more particularly for cryogenics, and particularly in an adiabatic demagnetization refrigerator (ADR). Use of the ceramic is particularly advantageous for 100 mK to 10 K applications.

The paramagnetic garnet ceramic could also be used for magnetic refrigeration at ambient temperature.

The paramagnetic garnet ceramic can also be used in an active magnetic regenerative refrigeration (AMRR) system.

The paramagnetic garnet ceramic can be used in any type of thermal regulation system.

Figure 1:
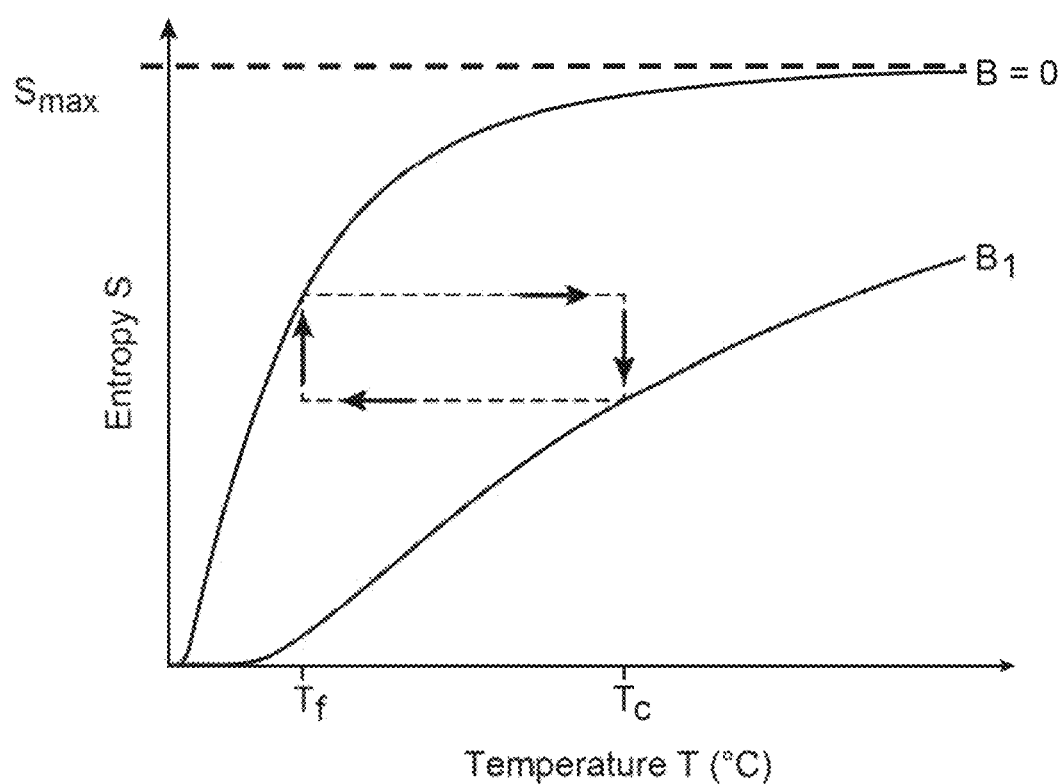
FIG. 1 described above represents a temperature-entropy diagram for a magnetic refrigeration cycle made with a paramagnetic material, FIG. 2a diagrammatically represents a cooling device according to one particular embodiment of the invention.
Figure 2A:
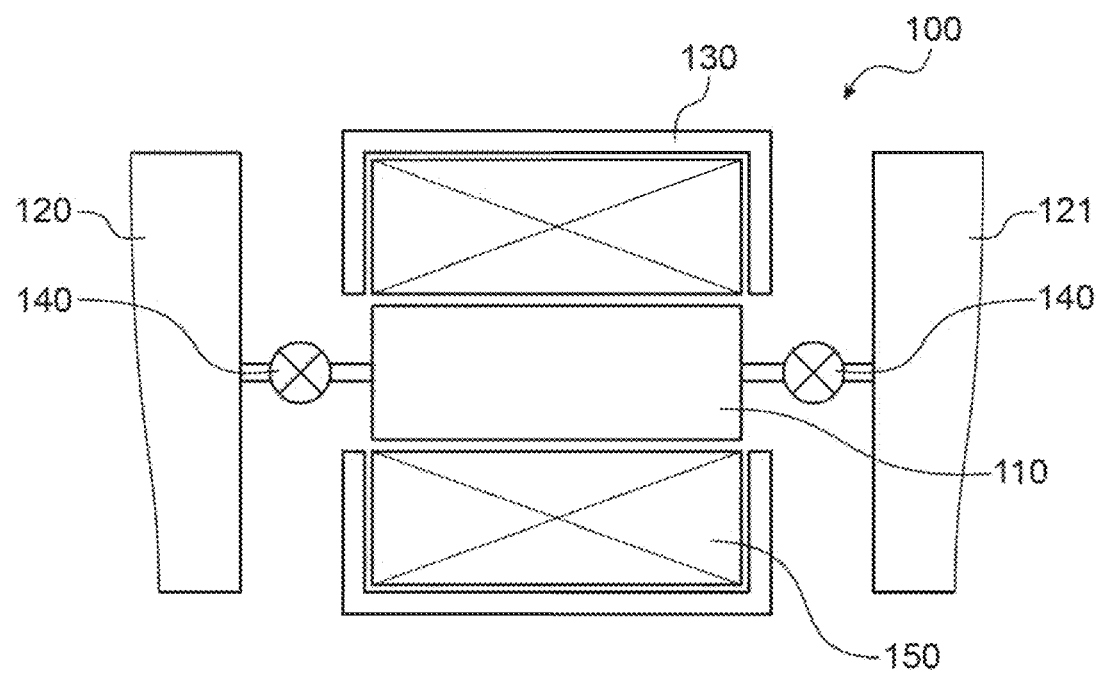
FIG. 2b diagrammatically represents a cooling device according to another particular embodiment of the invention.
Figure 2B:
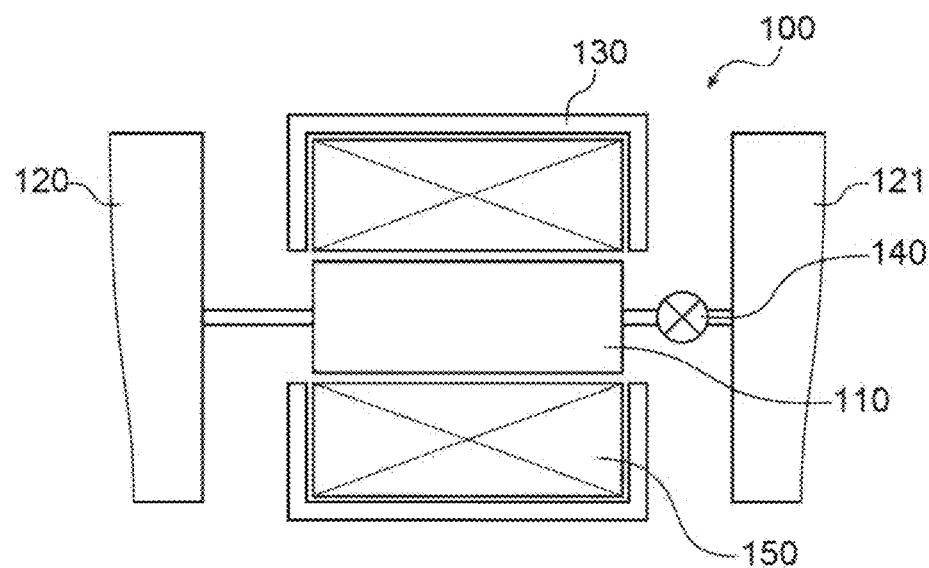
Figure 3:
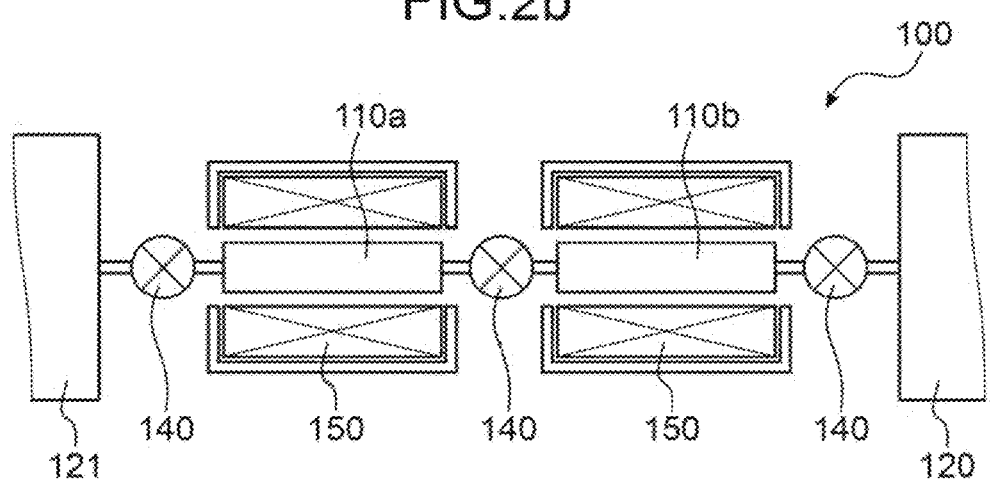
FIG. 3 diagrammatically represents a cooling device according to another particular embodiment of the invention.

Cooling Device:

Refer firstly to FIGS. 2a, 2b and 3 that represent cooling devices 100, and more particularly in adiabatic demagnetization refrigerators (ADR). These magnetocaloric devices 100 comprise at least;

a paramagnetic element 110, also called magnetocaloric element, a heat source 120 and a cold source 121, the paramagnetic element 110 being arranged between the cold source 121 and the heat source 120, a field generator 150 designed to produce an external magnetic fields.

Magnetocaloric Element:

The magnetocaloric element 110 is a paramagnetic material. It comprises, and is preferably composed of, a paramagnetic garnet ceramic. The use of a garnet ceramic, and particularly a GGG garnet ceramic or a YbGG garnet ceramic, opens up new prospects due to the very attractive paramagnetic properties of these materials and their mechanical robustness.

The magnetocaloric element 110 may be in the form of a cylindrical rod, a disk, or a more complex shape.

The dimensions of the magnetocaloric element 110 vary from a few mm$^3$ to several hundred dm$^3$, and preferably from a few cm$^3$ to 100 cm$^3$.

Only one magnetocaloric element 110 is used in the embodiment illustrated in FIGS. 2a and 2b. According to one variant embodiment, the cooling device 100 may include several magnetocaloric elements (for example two, three or four), arranged in series or in parallel. The different magnetocaloric elements can be separated by thermal switches 140. Larger temperature differences can then be obtained, or a continuous stage at an intermediate temperature can be obtained.

Figure 4:
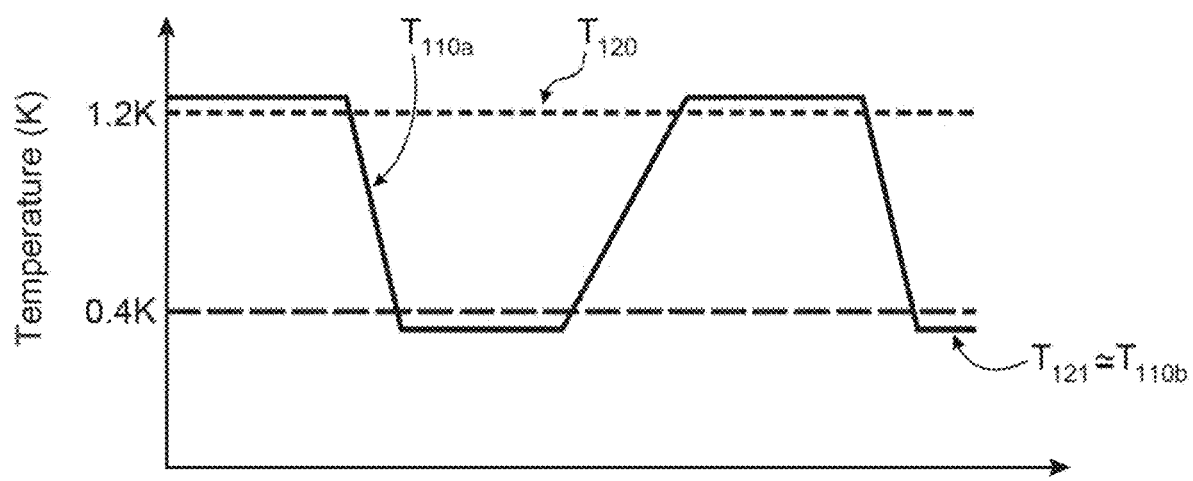
FIG. 4 is a graph representing temperature curves as a function of time, for a cooling device like that represented in FIG. 3, FIGS. 5a and 5b diagrammatically represent sectional elevation and top views respectively of part of a cooling device according to one particular embodiment of the invention.

For illustrative purposes, FIG. 3 represents a device 100 with two magnetocaloric element stages 110*a* and 110*b* arranged in series, and comprising two exchange gas thermal switches 140. Such a device 100 can obtain a large temperature difference, for example with the first element 110*a* being used to obtain cooling between 4 K and 1.2 K and the second element 110*b* obtaining cooling between 1.2 K and 0.4 K. This device can also be used to obtain continuous cooling, for example to 400 mK with power of the order of 50 µW. FIG. 4 represents the temperature curve as a function of time corresponding to such a device. The temperature of the heat source 120 and the paramagnetic elements 110*a* and 110*b* mounted in series is represented as a function of magnetisation/demagnetisation cycles. Thus, the temperature of the paramagnetic element 110*b*, located on the side of the cold source 121, is kept constant at the required cold temperature. The temperature of the paramagnetic element 110*a*, located on the side of the heat source 120, alternates between a temperature higher than the heat source 120, allowing transfer of heat to the heat source and a temperature lower than the cold source 121, to extract heat from the paramagnetic element.

This cooling device 100 nay be completed by other ADR type cooling stages, the other stages possibly including (independently of each other), a garnet ceramic or another magnetocaloric material, not necessarily in ceramic form, to also provide cooling below 200 mK.

Figure 5A:
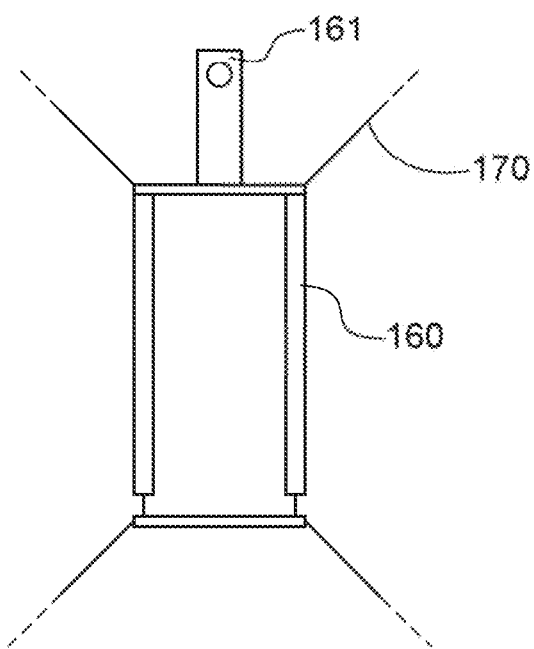
Figure 5B:
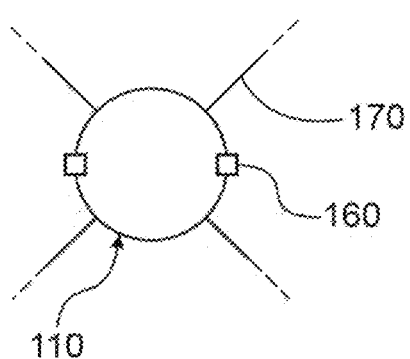

According to one advantageous embodiment represented on FIGS. 5*a* and 5*b*, at least one thermally conducting metallic material 160 is fixed on the magnetocaloric element 110 to improve the thermal conductivity. This is an element with a high thermal conductivity that carries heat exchanges between the interfaces (element to be cooled and heat source) and the magnetocaloric element 110. This element is also called the thermal bus.

The thermal bus 160 maybe in the form of wires. It may also be a plate. In all cases, the thermal bus has at least one interface 161 to which it will be thermally connected (to the heat source 120 or to the device to be cooled (cold source 121)). The thermally conducting element may for example be made of copper or stainless steel.

According to a first variant, the metallic element 160 is bonded to the magnetocaloric element 110, for example with a conducting epoxy type glue (for example Stycast).

According to another particularly advantageous variant, the metallic element 160 is brazed onto the magnetocaloric element 110.

In one variant, the possibility of having one or several metallic elements inside the ceramic could perfectly well be envisaged.

The magnetocaloric element 110 can be maintained by thermally insulating suspension means 170, typically kevlar wires, or carbon fibre tubes cable of fixing said element to a mechanical support, not shown.

Thermal Switch:

According to one particular embodiment, the ADR device also comprises at least one thermal switch 140 (or valve), arranged between the cold source 120 and the paramagnetic element 110 and/or between the heat source 121 and the paramagnetic element 110. The thermal switches may for example be exchange gas switches.

As represented on FIGS. 2*a* and 3, the thermal switches 140 are located between the heat source 120 and the cold source 121. The so-called hot switch is located between the heat source 120 and the paramagnetic element 110. The so-called cold switch is located between the cold source 121 and the paramagnetic element 110. The hot and cold switches are closed during the adiabatic demagnetisation and during adiabatic magnetisation. During the isothermal demagnetisation, the hot switch is open and the cold switch is closed. During the isothermal magnetisation, the hot switch is closed and the cold switch is open.

According to another variant embodiment shown on FIG. 2*a*, the part to be cooled, for example a detector, is thermally connected to the paramagnetic element and does not require a cold switch. The device comprises a single thermal switch 140, namely the hot switch.

For some applications, the thermal switches 140 can be replaced by a fluid called the cycle fluid that can circulate around and/or through the paramagnetic material. This embodiment is advantageous to obtain high powers and/or to perform fast cycles with large heat exchanges.

Figure 6:
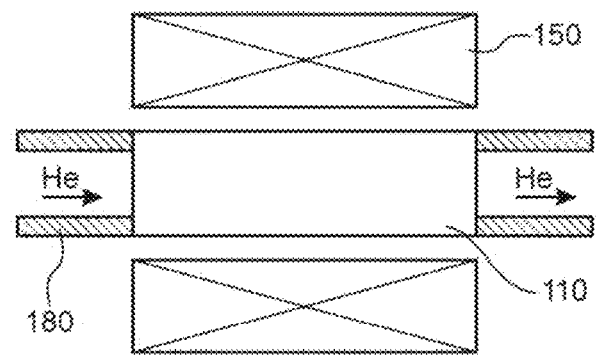
FIG. 6 diagrammatically represents a cooling device according to another particular embodiment of the invention, FIG. 7 diagrammatically represents a cooling device according to another particular embodiment of the invention.

To confine the fluid, an enclosure 180, for example made of stainless steel, is advantageously fixed on the magnetocaloric element 110 (FIG. 6). It may be fixed by bonding or preferably by soldering.

For example for an AMRR type device, the magnetisation and demagnetisation steps are alternated with the placement of a fluid flow that passes through the paramagnetic material in one direction and then in the other direction in order to create a temperature gradient inside the paramagnetic material. The four steps are: adiabatic magnetisation, fluid flow from hot to cold, adiabatic demagnetisation, fluid flow from cold to hot.

Field Generator:

The magnetic element 110 and the field generator 150 are positioned and configured such that a magnetic field is applied to the paramagnetic element 110 to produce heat or cold depending on the magnetisation/demagnetisation cycles. More particularly, an adiabatic demagnetisation, an isothermal demagnetisation, an adiabatic magnetisation and finally an isothermal magnetisation of the paramagnetic element 110 can be provoked successively and cyclically.

This field generator 150 can be formed from any element capable of creating a variable magnetic field. For example, it may be a coil of conducting wire or one or several permanent magnets that can be displaced relative to the paramagnetic element 110.

Magnetic screening means 130 can surround the field generator 150, so as to limit parasite magnetic fields outside the device.

According to a first embodiment, the position of the paramagnetic element is fixed relative to the field generator and the magnetic field is variable (FIGS. 2 and 3).

Figure 7:
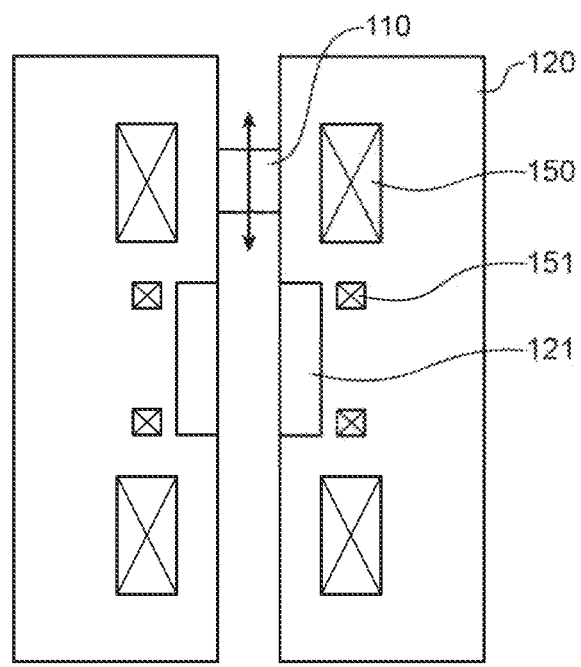

According to another embodiment, the position of the paramagnetic element 110 varies relative to the field generator 150 and the magnetic field is fixed (FIG. 7). Preferably, the device 100 comprises two fixed field generators between which the paramagnetic field is displaced alternately. Weak field generators 151 can be added into the device. The device does not comprise a thermal switch; the cooling device can use alternating helium flows.

According to another embodiment, not represented, the position of the paramagnetic element is fixed relative to the field generator and the magnetic field is fixed. There is no thermal switch, gravity and the different convection or condensation regimes are used.

For example, the field generator 150 comprises a magnetic element that will generate the magnetic field.

The field generator may for example be a superconducting coil.

Heat Source and Cold Source:

The magnetocaloric element 110 is thermally connected to the heat source 110 and to the cold source 121.

Advantageously, the cold source 121 and the heat source 120 are arranged along the same axis. According to one variant, the cold source 121 and the heat source 120 can be arranged arbitrarily.

Advantageously, the heat source 120 and the cold source 121 are arranged in the immediate environment of the magnetocaloric element 110 so as to easily and/or quickly recover at least part of the heat and/or cold that it emits. They can form a heat transfer fluid circuit.

Advantageously, helium will be used as the heat source 120 and as the cold source 121. Advantageously, the helium is a mixture of liquid and gas at different pressures and temperatures for the cold source 121 and the heat source 120.

The refrigeration device may also comprise:
fluid circulation means,
an electrical power supply, for example, slaved by a control unit, and
a heat sensor to determine the temperature of the heat transfer fluid.

The cooling device 100 can be used for high power applications (100 mW to several kW) or for refrigeration applications at ambient temperature.

The cooling device 100 can also be used for space applications: coolers below 100 mK and/or a stage to about 400 mK can be added for astrophysical missions.

For land applications, the same magnetocaloric garnet ceramic material would also be particularly suitable because, in addition to having low cost and being easy to integrate, it is capable of cooling to temperatures of less than one Kelvin. It can also be used for studies on quantum electronics.

Method of Elaborating Garnet Ceramic

The method of fabricating a garnet ceramic comprises several steps:
a) synthesis of a fine power of precursors, for example by reaction in solid phase,
b) fine grinding of the precursors powder,
c) forming of the material, for example in the form of a bar, the unsintered material having a density of less than 70%, preferably between 55% and 65%, for example of the order of 60% (unbaked part), and
d) heat treatment of the unbaked part below the melting temperature of the material to obtain a sintered ceramic with the required density.

The ground particles of synthesised powder preferably have a diameter of less than 10 μm, preferably from 1 μm to 7 μm and even more preferably from 3 μm to 5 μm. Such diameters facilitate obtaining a dense material at the end of the process. Particles forming the powder are advantageously monodispersed.

During step c), the particles are compacted.

During the sintering step (step d), the material is heated to below the melting temperature to make the grains coalesce, to reduce the internal porosity and thus density the material.

More particularly, during sintering, some grains coalesce together to become larger grains reducing the free space between the initial grains, which increases the density. "Necks" form between grains and grains interpenetrate until open and closed porosities are almost entirely eliminated.

During sintering, a majority of pores became clogged, but some residual gas spaces remain: the density of the ceramic will be less than 100%.

Finally, the ceramic is formed from a set of grains of different sizes. A first part of the grains (the largest grains) is coalesced and the other part of the grains (the smallest grains) is not coalesced or is only very slightly coalesced.

Process parameters will be chosen so as to obtain, for example, a density as close to 100% as possible, and preferably more than 95%.

The sintering temperature depends on the method of preparing the powder, the particle size and any additives that can have been added. Conventionally, the sintering temperature can be evaluated by dilatometry.

Illustrative and Non-Limitative Example of One Embodiment

A YbGG ceramic is obtained from $Ga_2O_3$ and $Yb_2O_3$ powders.

The powders are ground and mixed using a planetary mill (zirconium oxide bowl and balls). The presynthesis is made in an alumina crucible at 1050° C. under air. Forming is achieved by isostatic pressing in a natural rubber bladder at 2500 bars. The final temperature of the heat treatment is 1700° C. under air (temperature lower than the melting point of the YbGG compound).

The material thus produced has a final density of more than 95%, a smaller grain size that confers good mechanical properties and optimised conduction of heat.

Figure 8:
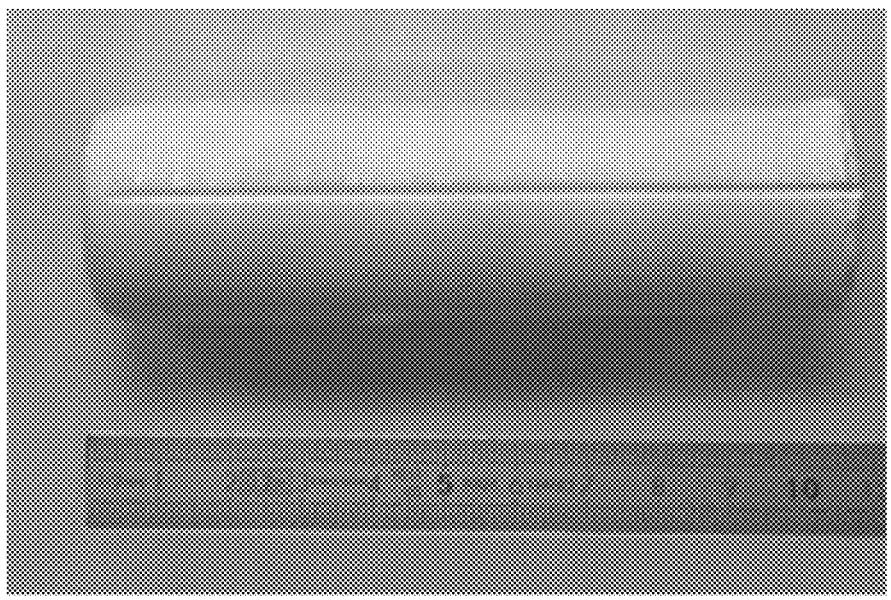
FIG. 8 is a photographic plate of a machined bar of a YbGG garnet ceramic according to one particular embodiment of this invention.
Figure 9:
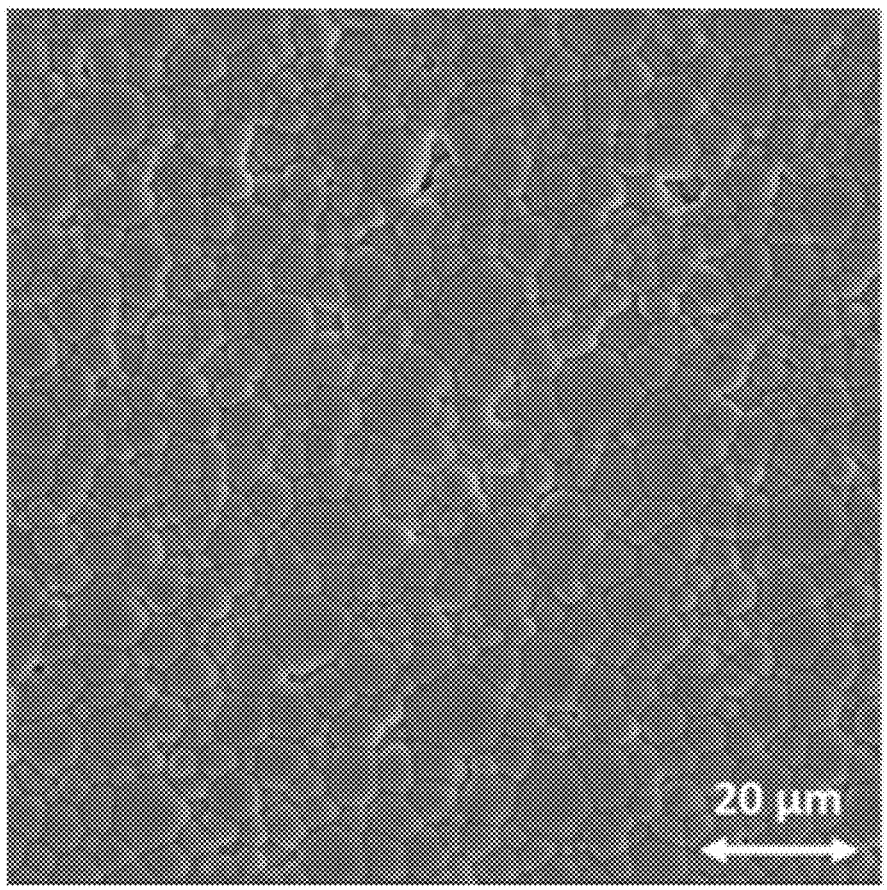
FIG. 9 is a plate obtained by scanning electron microscopy of a YbGG garnet ceramic sintered at 1700° C. under air, according to one particular embodiment of the invention.

The YbGG ceramic obtained is a 50 cm3 cylinder (FIGS. 8 and 9).

The garnet ceramic is placed in a superconducting coil. The heat source is at 2 Kelvin and cooling is done at 400 mK.

A paramagnetic garnet ceramic like that described above could also be used in a heating device.

The invention claimed is:

1. A magnetic cooling device comprising
a magnetocaloric element, the magnetocaloric element comprising a paramagnetic garnet, the paramagnetic garnet being a ceramic;
a heat source and a cold source, the paramagnetic garnet being arranged between the cold source and the heat source; and
a field generator designed to produce magnetic fields external to the field generator;
the magnetocaloric element and the field generator being positioned and configured such that a magnetic field is applied to the magnetocaloric element;
wherein the ceramic is selected from oxide ceramics and is a sintered ceramic comprising pores, and
wherein a relative density of the sintered ceramic is greater than or equal to 90% and less than 100%.

2. The device according to claim 1, wherein the sintered ceramic is formed from grains with different sizes, the grains being separated from each other by grain boundaries, the grain boundaries delimiting zones with different crystalline orientations.

3. The device according to claim 1, comprising
a first thermal switch located between the heat source and the magnetocaloric element; and
a second thermal switch located between the cold source and the magnetocaloric element,
wherein the first and second thermal switches are configured to have open and closed positions.

4. The device according to claim 1, wherein the relative density of the sintered ceramic is greater than or equal to 95% and less than 100%.

5. The device according to claim 1, wherein the magnetocaloric element is composed of the paramagnetic garnet ceramic.

6. The device according to claim 1, wherein the sintered ceramic contains gallium.

7. The device according to claim 6, wherein the sintered ceramic is a gadolinium gallium garnet ceramic.

8. The device according to claim 6, wherein the sintered ceramic is an ytterbium gallium garnet ceramic.

9. The device according to claim 1, wherein a volume of the magnetocaloric element varies from 1 mm$^3$ to 500 dm$^3$.

10. The device according to claim 1, wherein a volume of the magnetocaloric element varies from 1 cm$^3$ to 100 cm$^3$.

11. The device according to claim 1, wherein the magnetocaloric element is fixed to a metallic element.

12. The device according to claim 11, wherein the metallic element is bonded onto the magnetocaloric element.

13. The device according to claim 11, wherein the metallic element is brazed onto the magnetocaloric element.

14. The device according to claim 11, wherein the magnetocaloric element is a thermal bus.

15. The device according to claim 11, wherein the metallic element is an enclosure.

16. A magnetic cooling device comprising a magnetocaloric element, the magnetocaloric element comprising a paramagnetic garnet, the paramagnetic garnet being a ceramic,
wherein the ceramic is a sintered oxide ceramic comprising pores which is an ytterbium gallium garnet ceramic, and
wherein a relative density of the sintered ceramic is greater than or equal to 90% and less than 100%.

17. The device according to claim 1, wherein
the sintered ceramic is formed from grains with first and second sizes,
the first size is larger than the second size,
the grains with the first size are coalesced to form grains with a third size larger than the first size, and
the grains with the second size are not coalesced.

18. The device according to claim 1, wherein a volume of the magnetocaloric element varies from 50 cm$^3$ to 100 cm$^3$.

19. The device according to claim 1, wherein a volume of the magnetocaloric element varies from 70 cm$^3$ to 100 cm$^3$.

20. The device according to claim 1, wherein the magnetocaloric element is in the form of a cylindrical rod.

21. The device according to claim 1, wherein the paramagnetic garnet ceramic is obtained by a method comprising a sintering step.

* * * * *